(12) United States Patent
Shimomura et al.

(10) Patent No.: US 10,305,371 B2
(45) Date of Patent: May 28, 2019

(54) POWER SUPPLY CONTROL APPARATUS AND METHOD THEREOF

(71) Applicant: NISSAN MOTOR CO., LTD., Yokohama-shi, Kanagawa (JP)

(72) Inventors: Taku Shimomura, Kanagawa (JP); Tetsuya Hayashi, Kanagawa (JP); Dai Tsugawa, Kanagawa (JP); Takayuki Ikari, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 15/574,975

(22) PCT Filed: May 20, 2015

(86) PCT No.: PCT/JP2015/064443
§ 371 (c)(1),
(2) Date: Nov. 17, 2017

(87) PCT Pub. No.: WO2016/185579
PCT Pub. Date: Nov. 24, 2016

(65) Prior Publication Data
US 2018/0131178 A1 May 10, 2018

(51) Int. Cl.
*H02M 1/32* (2007.01)
*H02M 3/00* (2006.01)
*G01R 31/327* (2006.01)
*G01R 31/44* (2006.01)

(52) U.S. Cl.
CPC .......... *H02M 1/32* (2013.01); *G01R 31/3278* (2013.01); *G01R 31/44* (2013.01); *H02M 3/00* (2013.01)

(58) Field of Classification Search
CPC ......... H01H 9/542; H02H 9/001; H02M 3/00; H02M 7/48; H02M 2001/0009
See application file for complete search history.

(56) References Cited

U.S. PATENT DOCUMENTS

| | | | | |
|---|---|---|---|---|
| 6,157,097 A | * | 12/2000 | Hirose | H02M 7/062 307/125 |
| 7,505,291 B2 | * | 3/2009 | Wang | H02M 7/062 363/15 |
| 7,688,606 B2 | | 3/2010 | Amano | |
| 8,688,317 B2 | * | 4/2014 | Boiron | G01R 31/3278 324/426 |

(Continued)

FOREIGN PATENT DOCUMENTS

| | | |
|---|---|---|
| DE | 10 2012 105 010 A1 | 12/2012 |
| FR | 2948461 A1 | 1/2011 |

(Continued)

*Primary Examiner* — Kyle J Moody
(74) *Attorney, Agent, or Firm* — Foley & Lardner LLP

(57) ABSTRACT

A power supply control apparatus includes a DC power supply including a positive electrode and a negative electrode, a load electrically connected to the DC power supply, a relay connected to a current path from the positive electrode to the negative electrode through the load in series, a switching device connected to the current path in series, and a controller controlling the relay and the switching device. The controller, in a case in which the current path is to be electrically cut off, switches the switching device to an Off state and then switches the relay to the Off state.

15 Claims, 12 Drawing Sheets

(56) References Cited

U.S. PATENT DOCUMENTS

2002/0191426 A1* 12/2002 Hussein ................ H02H 9/001
363/50
2012/0191294 A1    7/2012 Boiron et al.
2012/0319648 A1   12/2012 Ohtomo
2017/0207634 A1*  7/2017 Katano .................. H02J 3/387

FOREIGN PATENT DOCUMENTS

| FR | 2961362 A1    | 12/2011 |
|----|---------------|---------|
| JP | 6-284709 A    | 10/1994 |
| JP | 2007-76514 A  | 3/2007  |
| JP | 2007-143221 A | 6/2007  |
| JP | 2015-039463 A | 3/2015  |

* cited by examiner

POWER SUPPLY CONTROL APPARATUS AND METHOD THEREOF

TECHNICAL FIELD

The present invention relates to a power supply control apparatus and a method thereof.

BACKGROUND ART

Power supply control apparatuses in which a limiting resistor used for preventing a rush current is removed have been disclosed. In such a power supply control apparatus, when a start instruction ST is received, the control device, performs a pre-charging process in which a capacitor C is charged by turning on system main relays SMR1 and SMR3. Here, since any limiting resistance is not disposed, the control device performs control of the gate voltage of a power MOSFET such that the power MOSFET of the system main relay SMR3 operates in a range not exceeding maximum rated electric power and in a saturated region. Then, after the pre-charging process is completed, a system main relay SMR2 is turned on, and the system main relay SMR3 is turned off (Patent Document 1).

PRIOR ART DOCUMENT

Patent Document

[Patent Document 1] JP 2007-143221 A

SUMMARY OF INVENTION

Problems to be Solved by Invention

However, in the power supply control apparatus described above, in a case in which a current flowing between a battery and a motor is cut off, the main relays SMR1 and SMR2 are turned off in a state in which the power MOSFET of the main relay SMR3 is turned off. For this reason, there is a problem in that contact points of the main relays SMR1 and SMR2 may easily deteriorate when the current is cut off.

An object to be achieved by the present invention is to provide a power supply control apparatus or a method thereof capable of suppressing the deterioration of contact points of relays.

Means for Solving Problems

According to the present invention, a switching device and a relay are connected to a current path from a positive electrode of a DC power supply to a negative electrode of the DC power supply through a load in series, and, in a case in which the current path is the non-conductive state, the current path is opened by setting the relay to the Off state and then switching the switching device to the Off state, whereby the problem described above is solved.

Effect of Invention

According to the present invention, since the relay is switched to the Off state before the switching device in a state in which a high current does not flow through the relay, there is an effect of suppressing deterioration of contact points of the relay.

MODE(S) FOR CARRYING OUT THE INVENTION

Hereinafter, embodiments of the present invention will be described with reference to the drawings.

First Embodiment

Figure 1:
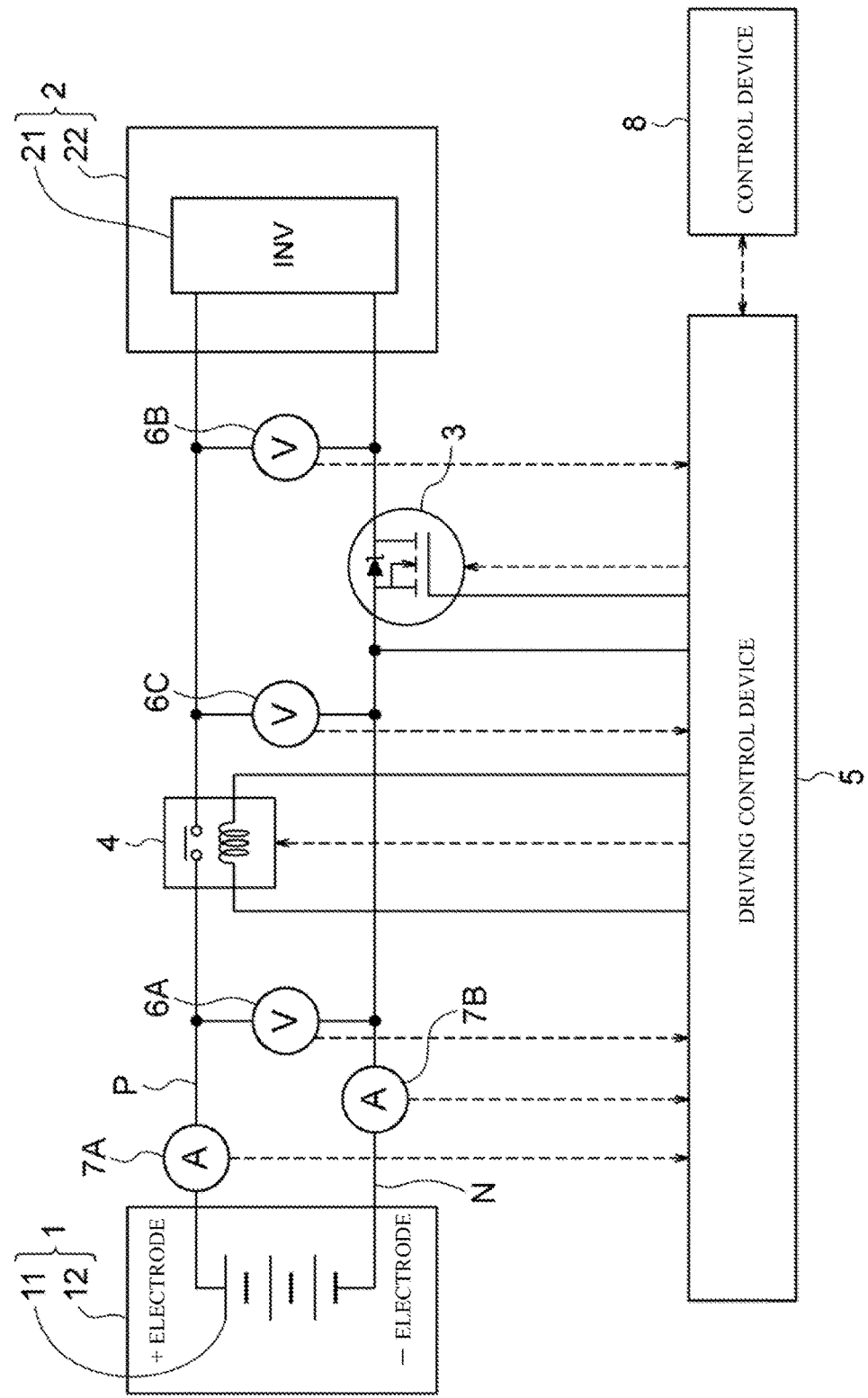
FIG. 1 is a block diagram of a power supply control apparatus according to this embodiment.

FIG. 1 is a block diagram of a power supply control apparatus according to an embodiment of the present invention. The power supply control apparatus according to this embodiment is disposed in a vehicle or the like. The power supply control apparatus a device that controls a system that supplies power of a battery mounted in the vehicle to a motor through an inverter. In description presented below, while a case in which the power supply control apparatus is disposed in a vehicle is premised, the power supply control apparatus is not limited to being disposed in a vehicle but may be disposed in another apparatus. For example, the power supply control apparatus may be applied to a power system for supplying the power of a stationary power supply to a load.

As illustrated in FIG. 1, the power supply control apparatus includes: a DC power supply 1; a load device 2; a switching device 3; a relay 4; a driving control device 5; voltage sensors 6A, 6B, and 6C; current sensors 7A and 7B; a control device 8; and power supply lines P and N. Here, the control device 8 may not necessarily be a configuration of the power supply control apparatus. In addition, while the driving control device 5 and the control device 8 are illustrated to be separate in FIG. 1, the driving control device 5 and the control device 8 may be configured as one control device. In FIG. 1, dotted-line arrows represent control signals.

The DC power supply 1 is a device that supplies power to the load device 2 and includes a battery 11 and a case 12. The battery 11 is formed by connecting a plurality of secondary cells such as lithium ion batteries. The battery 11 includes a positive electrode and a negative electrode. The positive electrode and the negative electrode of the battery 11 are connected to the load device 2 through one pair of the power supply lines P and N. The case 12 is a case formed by a metal used for housing the battery 11. In addition, the DC power supply 1 also has a function for storing electric power generated through regeneration of the load device 2 in the battery 11.

The load device 2 is a device that consumes the electric power of the DC power supply 1 and includes an inverter 21 and a case 22. The load device 2 is electrically connected to the DC power supply 1 through the power supply lines P and N. The inverter 21 is a power converting device that converts the power of the battery 11 and supplies converted power to a motor not illustrated in the drawing. The input side (DC side) of the inverter 21 is connected to the battery 11 through the power supply lines, and the output side (AC side) of the inverter 21 is connected to the motor. The case 22 is a case formed by a metal used for housing the inverter 21. The load device 2 is not limited to include the inverter 21 but may include a motor and may have a load (for example, a heating wire) other than the inverter 21.

The power supply lines P and N are one pair of wirings connecting the DC power supply 1 and the load device 2. In addition, the power supply lines P and N form a current path from the positive electrode of the DC power supply 1 to the negative electrode of the DC power supply 1 through the load device 2.

The switching device 3 is a semiconductor device having a switching function. In this embodiment, the switching device 3 is a P-channel MOSFET. The switching device 3 is connected to the power supply line N of the minus electrode side (negative electrode side). The switching device 3 is not limited to the MOSFET but may be an IGBT. In addition, the switching device 3 may be a switching device having a unipolar or bipolar structure formed by a wide band gap semiconductor material such as Si, SiC, or GaN.

In a case in which a direction from the DC power supply 1 to the load device 2 is defined as a forward direction, the power supply control apparatus according to this embodiment is configured to cut off a current flowing in the forward direction. For this reason, the switching device 3 is connected such that the conductive direction of the P-channel FET is the forward direction of the power supply line N. In a case in which a reverse-direction regeneration current is configured to be cut off using the switching device 3, the switching device 3 may be connected with the drain and the source of the switching device 3 illustrated in FIG. 1 reversed.

Figure 2:
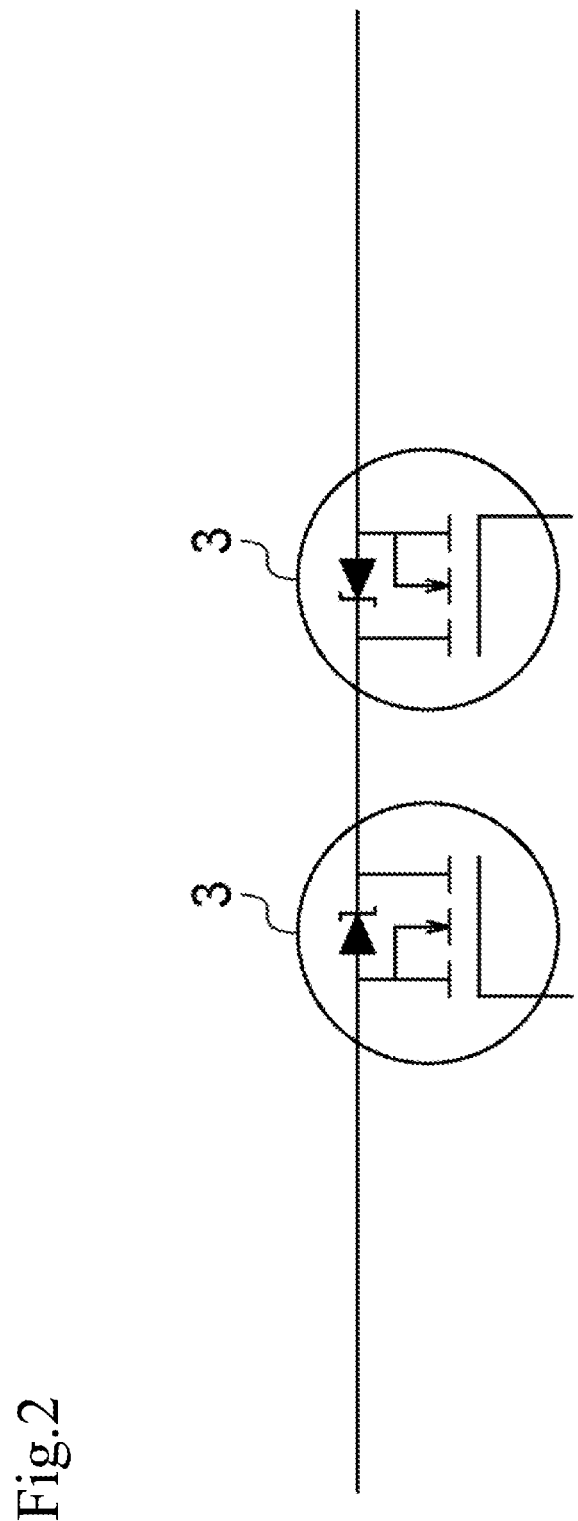
FIG. 2 is a circuit diagram describing an example of connection of switching devices in this embodiment.

In addition, in a case in which a forward-direction current and a reverse-direction current are to be cut off, as illustrated in FIG. 2, a plurality of switching devices 3 having no reverse breakdown performance may be connected in series. FIG. 2 is a circuit diagram that illustrates an example of connection of switching devices 3 capable of cutting off currents of both directions. As illustrated in FIG. 2, two switching devices 3 are P-channel MOSFETs and are connected in series in opposite directions.

Figure 3:
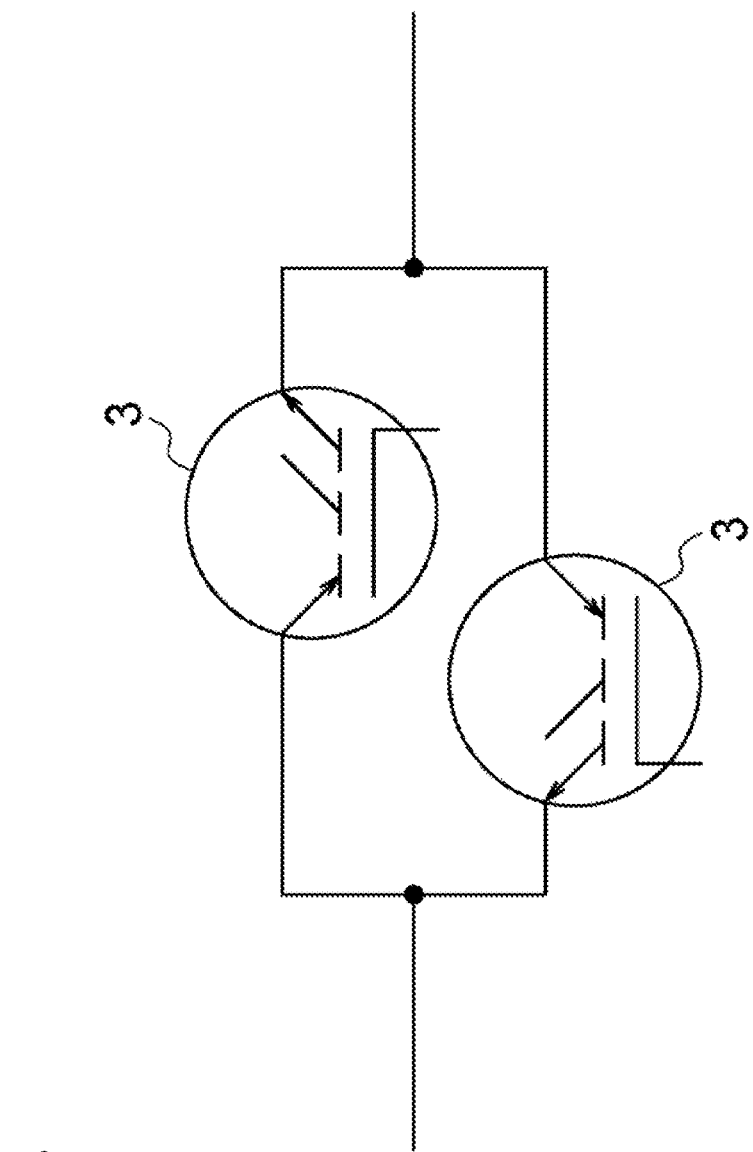
FIG. 3 is a circuit diagram describing an example of connection of switching devices in this embodiment.

In addition, as another example of the connection capable of cutting off currents of both directions, as illustrated in FIG. 3, switching devices 3 having reverse breakdown voltage performance may be connected in parallel. FIG. 3 is a circuit diagram that illustrates an example of connection of switching devices 3 capable of cutting off currents of both directions. As illustrated in FIG. 3, two switching devices 3 are IGBTs and are connected in parallel in opposite directions.

The relay 4 is a mechanical switch. As the relay 4, for example, an electromagnetic relay is used. The relay 4, different from the switching device 3, includes one pair of contact points that mechanically move according to On/Off of the switch. Out of the one pair of contact points, at least one contact point may dynamically operate. The relay 4 is connected to the power supply line P of the plus electrode side (positive electrode side). The relay 4 includes a coil and has a structure in which contact points are driven according to electromagnetic induction. Flow of a current through the coil generates the electromagnetic induction.

As described above, in a power supply control apparatus according to this embodiment, the power supply lines P and N forms a current path for conducting a current between the DC power supply 1 and the load device 2. In order to perform switching between electric conduction and cutting-off, the relay 4 and the switching device 3 are connected to the power supply lines P and N. Generally, one pair of relay switches are connected to a positive electrode-side power supply line and a negative electrode-side power supply line so that On/Off switching is performed between a DC power supply having a high voltage and a load. On the other hand, in the present invention, the role of the relay switch connected to the positive electrode side may be also added to the relay 4, and the role of the relay switch connected to the negative electrode side may be also added to the switching device 3. In other words, in this embodiment, the relay 4 is a switch enabling independent On/Off switching of a current path of any one of the positive electrode and the negative electrode.

In a case in which an electric potential difference (hereinafter, referred to as a first electric potential difference) between the positive of the battery 11 and the case 12 is different from an electric potential difference (hereinafter, referred to as a second electric potential difference) between the negative electrode of the battery 11 and the case, the switching device 3 is connected to be close to the side of an electrode having a smaller electric potential difference. For example, in a case in which the second electric potential difference is smaller than the first electric potential difference, the switching device 3 is connected to the power supply line N disposed on the negative electrode side, and the relay 4 is connected to the power supply line P disposed on the positive electrode side. Such a connection form is the connection form illustrated in FIG. 1. On the other hand, in a case in which the first electric potential difference is smaller than the second electric potential difference, the switching device 3 is connected to the power supply line P disposed on the positive electrode side, and the relay 4 is connected to the power supply line N disposed on the negative electrode side.

The switching device 3 has a possibility that a leakage current is generated inside the device also in an Off state. As the voltage is increased, the leakage current increases. For this reason, by connecting the switching device 3 to the power supply line having a lower electric potential difference out of the first electric potential difference and the second electric potential difference, a leakage current flowing from the case or the like to the switching device 3 can be suppressed.

The driving control device 5 is a controller that controls On/Off of the switching device 3 and the relay 4. The driving control device 5 performs switching between On/Off of the switching device 3 and the relay 4 based on a power supply permission signal transmitted from the control device 8. In addition, the driving control device 5 performs switching between On/Off of the switching device 3 and the relay 4 based on detection values of the voltage sensors 6A to 6C and the current sensors 7A and 7B. Furthermore, the driving control device 5 also has a self-diagnosis function for the switching device 3 and the relay 4.

The voltage sensor 6A detects a voltage of the input side in a current path between the DC power supply 1 and the load device 2. Out of both terminals of the voltage sensor 6A, a high electric potential-side terminal is connected to the power supply line P between the positive electrode of the battery 11 and the relay 4, and the low electric potential-side terminal is connected to the power supply line N.

The voltage sensor 6B detects a voltage of the output side in the current path between the DC power supply 1 and the load device 2. Out of both terminals of the voltage sensor 6B, a high electric potential-side terminal is connected to the power supply line P between the relay 4 and the inverter 21, and the low electric potential-side terminal is connected to the power supply line N between the switching device 3 and the inverter 21.

The voltage sensor 6C detects a voltage of the output side of the relay 4 in the current path between the DC power supply 1 and the load device 2. Out of both terminals of the voltage sensor 6C, a high electric potential-side terminal is connected to the power supply line P between the relay 4 and the inverter 21, and the low electric potential-side terminal is connected to the power supply line N between the switching device 3 and the negative electrode of the battery 11.

The current sensor 7A is a sensor that detects a current of the power supply line P and is connected to the power supply line P between the positive electrode of the battery 11 and the relay 4. The current sensor 7B is a sensor that detects a current of the power supply line N and is connected to the power supply line N between the negative electrode of the battery 11 and the switching device 3.

The detected voltages detected by the voltage sensors 6A, 6B, and 6C and the detected currents detected by the current sensors 7A and 7B are output to the driving control device 5.

The control device 8 is a controller that controls the overall operation of the vehicle. The control device 8 can communicate with the driving control device 5 using control signals. In addition, the control device 8 transmits a power supply permission signal to the driving control device 5 in accordance with the state of a main switch of the vehicle. When the power supply permission signal is On, it represents that the supply of power from the DC power supply 1 to the load device 2 is permitted. On the other hand, when the power supply permission signal is Off, it represents that the supply of power from the DC power supply 1 to the load device 2 is not permitted. For example, when the main switch of the vehicle is switched from Off to On in accordance with a user operation, the control device 8 sets the power supply permission signal to be in the On state by setting the level of the power supply permission signal to high. On the other hand, when the main switch is switched from On to Off, the control device 8 sets the power supply permission signal to be in the Off state by setting the level of the power supply permission signal to low.

Next, detailed control of the driving control device 5 will be described. First, control performed when the power supply control apparatus is started (started to operate) will be described. The control device 5 starts the operation of the system for power supply by electrically conducting the current path between the DC power supply 1 and the load device 2. More specifically, in a case in which a current permission signal that is in the On state is received from the control device 8, the driving control device 5 performs control in the following sequence such that the current path between the DC power supply 1 and the load device 2 is electrically conducted.

Figure 4:
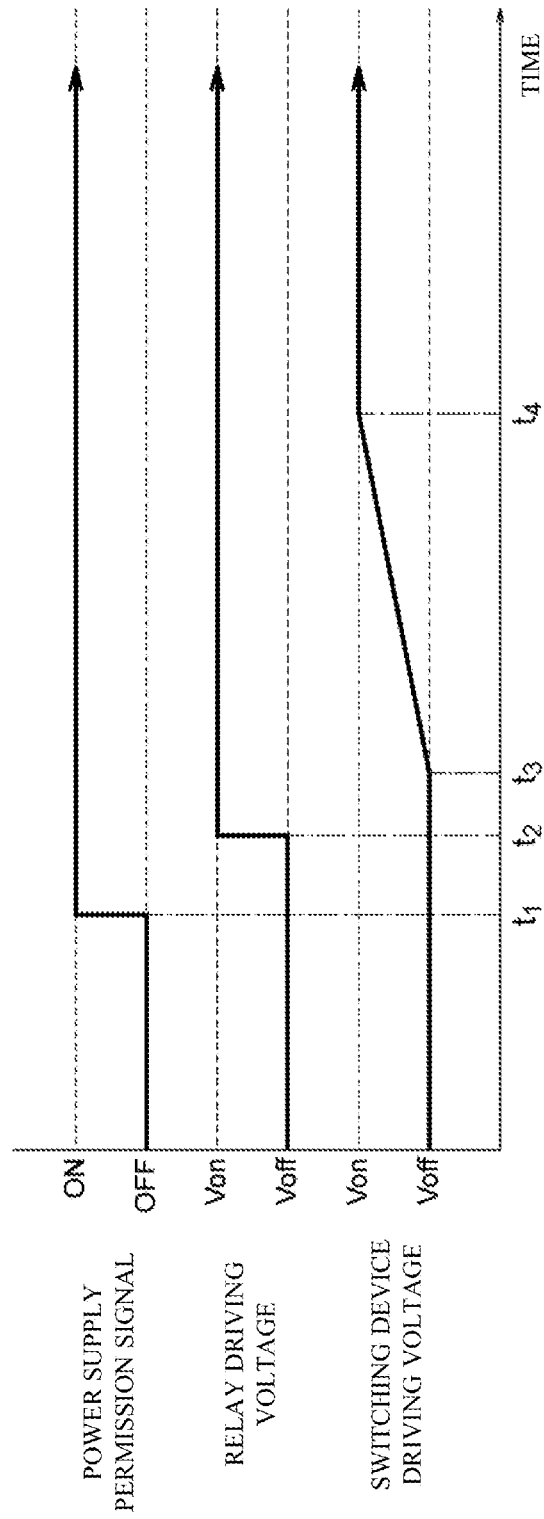
FIG. 4 represents graphs illustrating the On/Off state of a power supply signal and the characteristics of a driving voltage of a relay and a driving voltage of a switching device in a case in which a current path is electrically conducted.

FIG. 4 represents graphs illustrating the On/Off state of the power supply signal and the characteristics of the driving voltage of the relay 4 and the driving voltage of the switching device 3 in a case in which the current path between the DC power supply 1 and the load device 2 is electrically conducted. In the graphs illustrated in FIG. 4, the horizontal axis represents the time. The driving voltage of the relay 4 represents a voltage applied to the coil of the relay 4 based on a control signal of the driving control device 5. The relay 4 is in the On state when the driving voltage is $V_{ON}$, and the relay 4 is in the Off state when the driving voltage is $V_{OFF}$. The driving voltage of the switching device 3 corresponds to the gate voltage of the switching device 3. In addition, in graphs illustrated in FIGS. 5 to 9, the vertical axis and the horizontal axis are similar to the vertical axis and the horizontal axis of the graphs illustrated in FIG. 4.

In a case in which the power supply signal is Off, the switching device 3 and the relay 4 are in the Off states. In other words, in a case in which a current does not need to flow between the DC power supply 1 and the load device 2, both the switching device 3 and the relay 4 maintain the Off states. Accordingly, the impedance of the current path is maintained to be high, and the security of the system can be improved. In addition, in a case in which the high impedance of the current path can be maintained by setting one switch of the switching device 3 and the relay 4 to Off, only any one of the switching device 3 and the relay 4 may be set to be in the Off state.

As illustrated in FIG. 4, in the initial state, the power supply signal is Off, and the driving voltage of the relay 4 and the driving voltage of the switching device 3 are $V_{OFF}$. At time $t_1$, when the power supply signal is switched from Off to On, the driving control device 5 raises the driving voltage of the relay 4 from $V_{OFF}$ to $V_{ON}$ at time $t_2$ that is after elapse of a predetermined time from the time $t_1$, thereby switching the relay 4 from the Off state to the On state. At time $t_3$ after elapse of a predetermined from the time $t_2$, the driving control device 5 raises the driving voltage of the switching device 3 from $V_{OFF}$. Then, at time $t_4$, the driving voltage of the switching device 3 becomes $V_{ON}$, and the switching device 3 is switched to the On state.

In a case in which the current path is electrically conducted, and power is supplied from the DC power supply 1 to the load device 2, a current flows from a place having high electric potential to a place having low electric potential. In a case in which a circuit element having parasitic capacitance or a capacitance component is connected to the place having low electric potential, for example, in a case in which a smoothing capacitor is connected to the input side (DC side) of the load device 2, in an initial state at the time of electrically conducting the current path, a rush current flows from the DC power supply 1 to the load device 2. The less the impedance of the current is, the more the rush becomes. In a case in which a large rush current flows through the relay 4, the fixation of contact points of the relay 4 or an adverse effect on the switching device 3 is caused. In addition, there is concern that a surge voltage is generated according the inductance of the current path and the rush current. For this reason, in a case in which the current path is electrically conducted, a current needs to flow between the DC power supply 1 and the load device 2 while limiting the current flowing from the DC power supply 1 to the current path.

As described above, in this embodiment, in a case in which the current path is electrically conducted, the driving control device 5 switches the relay 4 to the On state and then switches the switching device 3 to the On state. Since the switching device 3 is a MOSFET, the driving control device 5 can adjust the On resistance of the switching device 3 by controlling the gate voltage and can arbitrary change the amount of the current flowing through the current path. The relay 4 is already in the On state at the time point of the time $t_3$. For this reason, by switching the switching device 3 to the On state while adjusting the gate voltage such that the On resistance of the switching device 3 is increased, a rush current flowing from the DC power supply 1 to the current path can be suppressed.

In addition, in this embodiment, the driving voltage of the switching device 3 is gradually raised from a low state from time $t_3$. Accordingly, the On resistance of the switching device 3 can be gradually adjusted from a high state to the low state, whereby a rush current can be suppressed.

In addition, in a period from the time $t_3$ to time $t_4$, the driving control device 5 may adjust the gate voltage to be optimal for preventing the rush current while managing the current flowing from the DC power supply 1 to the current path by using the voltage sensors 6A to 6C or the current sensors 7A and 7B. The current flowing from the DC power supply 1 to the current path, for example, can be detected by a voltage difference between the detected voltage detected by the voltage sensor 6A and the detected voltage detected by the voltage sensor 6B, a detected voltage detected by the voltage sensor 6C, or detected currents detected by the current sensors 7A and 7B.

In order to adjust the gate voltage, the driving control device 5 may adjust the gate voltage such that the current flowing through the current path does not exceed an allowed current value of each device connected to the current path. In addition, the driving control device 5 may adjust the gate voltage such that the temperature of each device is not higher than the allowed temperature, or a voltage applied to each device is higher than an allowed value in accordance with the current flowing through the current path. The temperature and the voltage of each device may be managed by arranging separate sensors and using detected values detected by the sensors or may be managed by acquiring estimated values from the detected values detected by the voltage sensors 6A to 6C through arithmetic operations. The value of the gate voltage at the time of adjustment may be set in advance or may be set in real time based on the detected value detected by sensors.

In addition, the shorter a predetermined time from the time $t_1$ to the time $t_2$ is, and the shorter a predetermined time from the time $t_2$ to the time $t_3$ is, the shorter the starting time of the system can be.

In this embodiment, when the system of power supply is started, the driving control device 5 may perform self-diagnoses of the switching device 3 and the relay 4. The control sequence of the driving control device 5 will be described with reference to FIG. 5.

Figure 5:
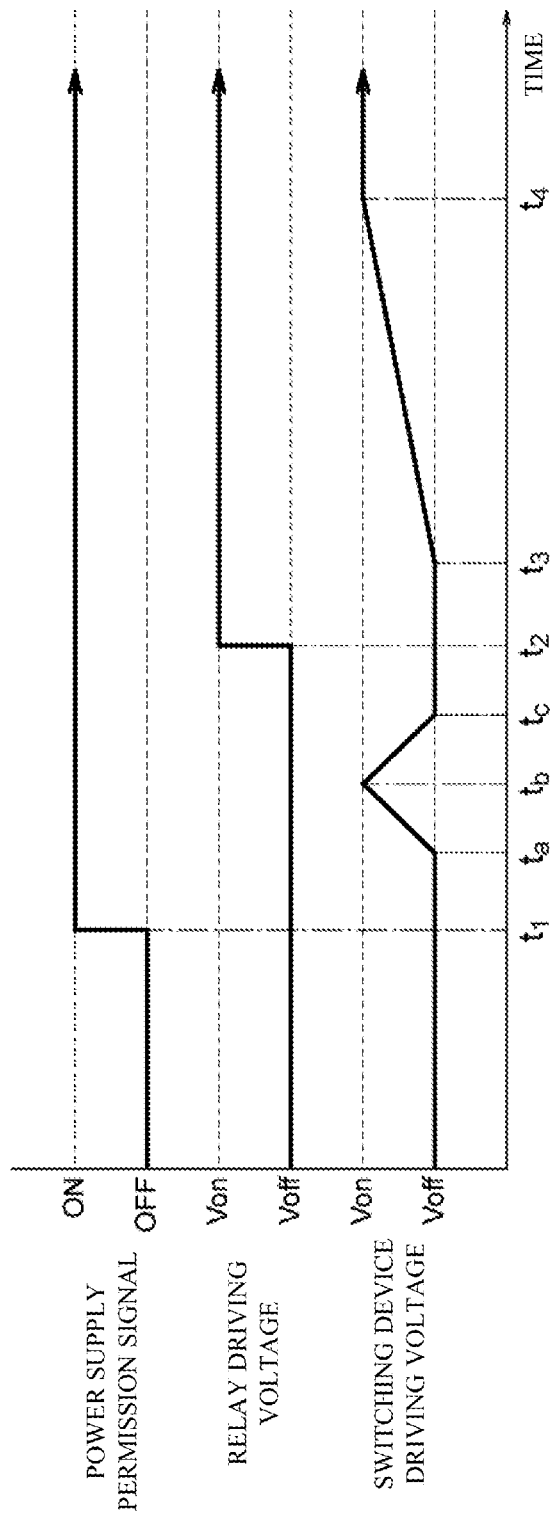
FIG. 5 represents graphs illustrating the On/Off state of a power supply signal and the characteristics of a driving voltage of a relay and a driving voltage of a switching device in a case in which a current path is electrically conducted.

FIG. 5 represents graphs illustrating the On/Off state of the power supply signal and the characteristics of the driving voltage of the relay 4 and the driving voltage of the switching device 3 in a case in which self-diagnoses of the switching device 3 and the relay 4 are performed while the current path between the DC power supply 1 and the load device 2 is electrically conducted.

In the initial state, the power supply signal is Off, and the driving voltage of the relay 4 and the driving voltage of the switching device 3 are $V_{OFF}$. The power supply signal is switched from Off to On at time $t_1$, the driving voltage of the relay 4 is raised from $V_{OFF}$ to $V_{ON}$ at time $t_2$, the driving voltage of the switching device 3 is gradually raised from $V_{OFF}$ at time $t_3$, and the driving voltage of the switching device 3 becomes $V_{ON}$ at time $t_4$, which is similar to the control of the sequence described with reference to FIG. 4.

The driving control device 5 performs control of the switching device 3 such that the driving voltage of the switching device 3 is temporarily raised within a predetermined period from the time $t_1$ to the time $t_2$, and, after the driving voltage is raised, the driving voltage is lowered up to $V_{OFF}$. The driving control device 5, at time $t_a$ that is after the time $t_1$, raises the driving voltage of the switching device 3 from $V_{OFF}$. When the driving voltage becomes $V_{ON}$ at time $t_b$ that is after the time $t_a$, the driving control device 5 lowers the driving voltage of the switching device 3 from $V_{ON}$. Then, at time $t_c$, the driving voltage becomes $V_{OFF}$. Accordingly, in a case in which the current path is conducted, the driving control device 5 sets the switching device 3 to be in the On state for a period from the time $t_a$ to the time $t_c$ before switching the relay 4 to the On state.

The driving control device 5 performs fault diagnoses of the switching device 3 and the relay 4 for a period from the time $t_1$ to the time $t_c$ based on the detected values detected by the voltage sensors 6A to 6C or the detected values detected by the current sensors 7A and 7B. In a case in which the relay 4 is normal, for the period of the time $t_a$ to the time $t_c$, even when the driving voltage of the switching device 3 is higher than $V_{OFF}$, the current does not flow from the DC power supply 1 to the current path. For this reason, for the period from the time $t_a$ to the time $t_c$, there is no change in the detected values detected by the voltage sensors 6A to 6C or the detected values detected by the current sensors 7A and 7B, or there are small amounts of changes in the detected values even there are changes. On the other hand, in a case in which a fault of a short-circuit formation (On fixation) of the relay 4 occurs, for the period from the time $t_a$ to the time $t_c$, when the driving voltage of the switching device 3 is higher than $V_{OFF}$, a current starts to flow from the DC power supply 1 to the current path.

The driving control device 5, for the period of the time $t_a$ to the time $t_c$, compares the detected values detected by the voltage sensors 6A to 6C or the detected values detected by the current sensors 7A and 7B with thresholds and determines whether or not there is a fault in the relay 4 based on a result of the comparison. Here, the thresholds are values set in advance for a fault diagnosis of the relay 4.

When the fault diagnosis is performed, the driving control device 5 does not need to use the detected values detected by all the sensors among the voltage sensors 6A to 6C and the current sensors 7A and 7B but may use at least one detected value. In a case in which a fault diagnosis of the relay 4 is performed using a detected value that increases according to a fault of the relay 4, the driving control device 5 determines that there is a fault in the relay 4 in a case in which the detected value is higher than the threshold. On the other hand, in a case in which a fault diagnosis of the relay 4 is performed using a detected value that decreases according to a fault of the relay 4, the driving control device 5 determines that there is a fault in the relay 4 in a case in which the detected value is lower than the threshold. The selection of a detected value at the time of performing the fault diagnosis and a criterion for the determination in a case in which the detected value is compared with the threshold are not limited to be applied to the fault diagnosis of the relay 4 but may be also applied at the time of performing a fault diagnosis of the switching device 3 to be described below. The detected values compared with the threshold may be detected values detected by the voltage sensors 6A to 6C and the current sensors 7A and 7B but may be a difference between the detected values detected by the sensors.

In addition, the shorter the period from the time $t_a$ to the time $t_c$ is, the shorter the starting time of the system is, and the standby power can be suppressed. In addition, when a fault of short-circuit formation of the relay 4 occurs for the period from the time $t_a$ to the time $t_c$, a current flows from the DC power supply 1 to the current path. Then, for a period from the time $t_b$ to the time $t_c$, the current is cut off, and accordingly, there is concern that a surge voltage is generated according to a change in the amount of the current. For this reason, the period from the time $t_b$ to the time $t_c$ is preferably short as possibly as can such that there is no adverse effect of the surge voltage on devices while considering the withstand voltage of each device on the current path and the inductance of the current path.

In this way, in this embodiment, in a case in which the current path is electrically conducted, the driving control device 5, before switching the relay 4 to the On state, for the period from the time $t_b$ to the time $t_c$, sets the switching device 3 to be in the On state, and, within the period from the time $t_b$ to the time $t_c$, performs a fault diagnosis of the relay 4 based on detected values detected by the sensors. Accordingly, the protection of circuit devices and the like are achieved, while the security of the system is secured.

The driving control device 5 may perform a fault diagnosis of the switching device 3 after the time $t_2$. The driving control device 5, for the period from the time $t_2$ to the time $t_3$, performs a fault diagnosis of the switching device 3 based on the detected values detected by the voltage sensors 6A to 6C or the detected values detected by the current sensors 7A and 7B. In a case in which the switching device 3 is normal, for the period from the time $t_2$ to the time $t_3$, even when the relay 4 is switched to the On state, a current does not flow from the DC power supply 1 to the current path. Then, for the period from the time $t_2$ to the time $t_3$, there is no change in the detected values detected by the voltage sensors 6A to 6C or the detected values detected by the current sensors 7A and 7B, or the amounts of changes in the detected values are small even there are changes. On the other hand, in a case in which a fault of short-circuit formation of the switching device 3 occurs, for the period from the time $t_2$ to the time $t_3$, a current starts to flow from the DC power supply 1 to the current path. For this reason, the driving control device 5, for the period from the time $t_2$ to the time $t_3$, can diagnose a fault of the switching device 3 based on a comparison result, while comparing the detected values detecting using the sensors with thresholds set in advance.

In this way, in this embodiment, in a case in which the current path is electrically conducted, the driving control device 5 performs a fault diagnosis of the switching device 3 based on detected values detected by sensors within a period from a time point (time $t_2$) at which the relay 4 is switched to the On state to a time point (time $t_3$) at which the switching device 3 is set to be in the On state. In this way, the protection of circuit devices and the like can be achieved while the security of the system improves.

In addition, the driving control device 5 may perform fault diagnoses of the switching device 3 and the relay 4 after the time $t_3$. The driving control device 5 performs fault diagnoses of the switching device 3 and the relay 4 based on the detected values detected by the voltage sensors 6A to 6C or the detected values detected by the current sensors 7A and 7B for a predetermined period after the time $t_3$. In a case in which the switching device 3 and the relay 4 are normal, after the time $t_3$, in accordance with an increase in the driving voltage of the switching device 3, a current flows from the DC power supply 1 to the current path. In addition, also after the driving voltage of the switching device 3 becomes $V_{ON}$, a current flows from the DC power supply 1 to the current path. Then, as the current flows from the DC power supply 1 to the current path, the detected values detected by the voltage sensors 6A to 6C or the detected values detected by the current sensors 7A and 7B change. On the other hand, in a case in which any one of a fault of open-circuit formation of the switching device 3 and a fault of open-circuit formation of the relay 4 occurs, a current does not flow from the DC power supply 1 to the current path. In addition, there is no change in the detected values detected by the voltage sensors 6A to 6C or the detected values detected by the current sensors 7A and 7B, or there are small amounts of changes in the detected values even when there are changes. For this reason, the driving control device 5 can diagnose faults of the switching device 3 and the relay 4 based on a comparison result while comparing detected values detected by the sensors with thresholds set in advance for a predetermined period after the time $t_3$.

In this way, in this embodiment, in a case in which the current path is electrically connected, the driving control device 5 switches the relay 4 to the On state and then, performs fault diagnoses of the switching device 3 and the relay 4 based on the detected values detected by the sensors. Accordingly, the protection of circuit devices and the like can be achieved while the security of the system improves.

Next, control at the time of shutting down the power supply control apparatus will be described. When a power supply signal of the Off state is received in a state in which the switching device 3 and the relay 4 are On, the driving control device 5 performs control of the switching device 3 and the relay 4 to electrically cut off the current path. The power supply signal of the Off state is transmitted from the control device 8 to the driving control device 5 regardless of the conduction state of the current flowing through the current path. For this reason, the driving control device 5 sets the switching device 3 and the relay 4 to the Off states in a state in which the current flows through the current path. At this time, in the state in which a high current flows through the relay 4, the relay 4 is switched from On to Off, contact points of the relay 4 deteriorate due to heat generation at the contact points of the relay 4 and the like, there is concern that the contact resistance increases. In addition, it may also cause fixation of the contact points and the like. In this embodiment, in order to prevent the deterioration of the relay 4, the driving control device 5 controls the switching device 3 and the relay 4 in the following sequence when the current path between the DC power supply 1 and the load device 2 is electrically cut off.

Figure 6:
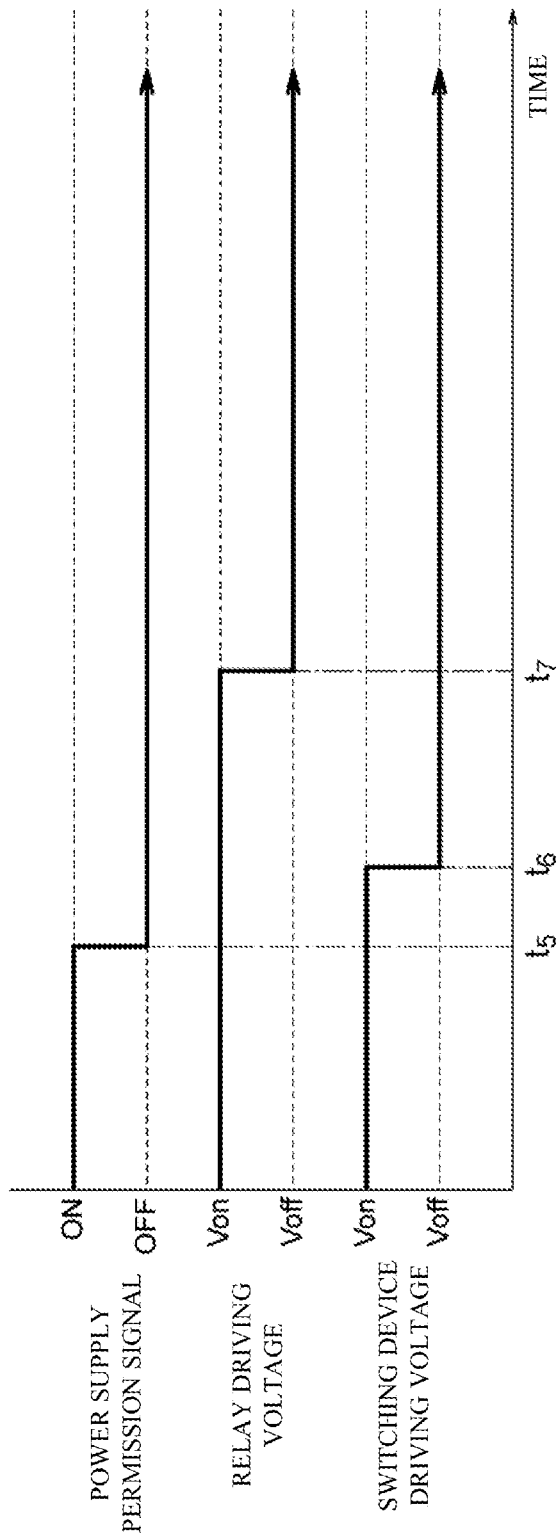
FIG. 6 represents graphs illustrating the On/Off state of a power supply signal and the characteristics of a driving voltage of a relay and a driving voltage of a switching device in a case in which a current path is electrically cut off.

FIG. 6 represents graphs illustrating the On/Off state of the power supply signal and the characteristics of the driving voltage of the relay 4 and the driving voltage of the switching device 3 in a case in which the current path between the DC power supply 1 and the load device 2 is electrically cut off.

As illustrated in FIG. 6, as an initial state before electrical cutting-off of the current path, the power supply signal is On, and the driving voltage of the relay 4 and the driving voltage of the switching device 3 are $V_{ON}$. At time $t_5$, when the power supply signal is switched from On to Off, the driving control device 5, at time $t_6$ that is after the elapse of a predetermined time from the time $t_5$, lowers the driving voltage of the switching device 3 from $V_{ON}$ to $V_{OFF}$, thereby switching the switching device 3 from the On state to the Off state. Then, the driving control device 5, at time $t_7$ that is after the elapse of a predetermined time from the time $t_6$, lowers the driving voltage of the relay 4 from $V_{ON}$ to $V_{OFF}$, whereby switching the relay 4 from the On state to the Off state.

In this embodiment, in a case in which the current path is electrically cut off, the driving control device 5 switches the switching device 3 to the Off state and then, switches the relay 4 to the Off state. Accordingly, the deterioration of the contact points of the relay 4 can be prevented, and the reliability of the power supply control apparatus can be improved.

Figure 7:
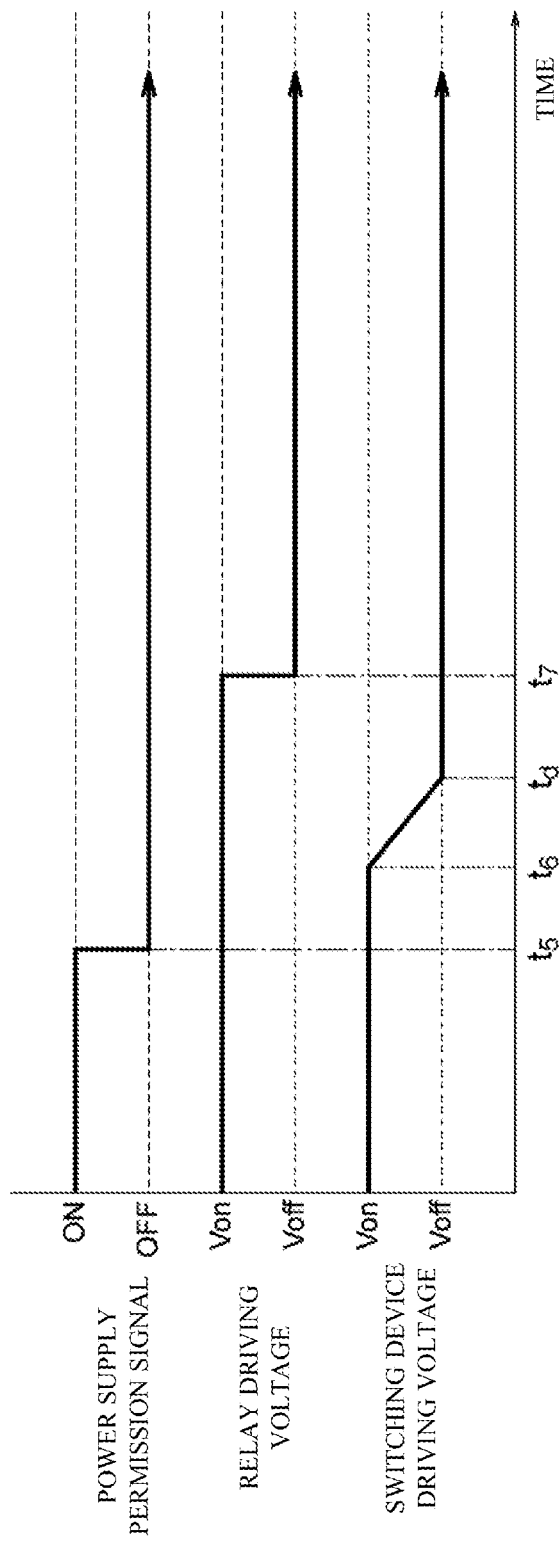
FIG. 7 represents graphs illustrating the On/Off state of a power supply signal and the characteristics of a driving voltage of a relay and a driving voltage of a switching device in a case in which a current path is electrically cut off.

In addition, when the current path between the DC power supply 1 and the load device 2 is electrically cut off, the driving control device 5 may control the switching device 3 and the relay 4 in a sequence illustrated in FIG. 7 instead of the sequence illustrated in FIG. 6.

FIG. 7 represents graphs illustrating the On/Off state of the power supply signal and the characteristics of the driving voltage of the relay 4 and the driving voltage of the switching device 3 in a case in which the current path between the DC power supply 1 and the load device 2 is electrically cut off.

In FIG. 7, the level of the power supply signal is lowered from On to Off at the time $t_5$, and the driving voltage of the relay 4 is lowered from $V_{ON}$ to $V_{OFF}$ at the time $t_7$, which is similar to the sequence illustrated in FIG. 6. The driving control device 5, before switching the relay 4 to the Off state, when the driving voltage of the switching device 3 is lowered, gradually lowers the driving voltage in accordance with the elapse of the time. In other words, the driving control device 5 gradually lowers the driving voltage of the switching device 3 from $V_{ON}$ at time $t_6$ and lowers the driving voltage of the relay 4 up to $V_{OFF}$ at time $t_d$. Accordingly, in this embodiment, when the current of the current path is cut off (when the switching device 3 is turned off), the generation of a surge voltage according to a change in the current can be suppressed. Here, it is preferable to shorten a period from the time $t_6$ to the time $t_d$ as possibly as can such that there is no adverse effect of the surge voltage on devices in consideration of the withstand voltage of each device on the current path and the inductance of the current path. In addition, in order to shorten the start time of the system, a period from the time $t_5$ to the time $t_6$ and a period from the time $t_d$ to the time $t_7$ are preferably short as possibly as can.

Next, the control of the driving control device 5 of a case in which the current path is in a non-conductive state will be described. The non-conductive state (no current state) is a state in which a current flowing from the DC power supply 1 or the load device 2 to the current path is lower than a predetermined threshold and is a state in which a current flowing through the current path is zero or close to zero. The driving control device 5 detects a current of the current path by using the voltage sensors 6A to 6C or the current sensors 7A and 7B. The driving control device 5 compares a detected current with a current threshold and, in a case in which the detected current is lower than the current threshold, determines a non-conductive state. In the non-conductive state is a state in which a current does not need to be supplied from the DC power supply 1 to the load device 2 and may be regarded as a state in which a current does not need to be supplied to the DC power supply 1 by regenerating the load device 2. For this reason, the driving control device 5, in the non-conductive state, controls the switching device 3 and the relay 4 in the following sequence and performs self-diagnoses of the switching device 3 and the relay 4.

Figure 8:
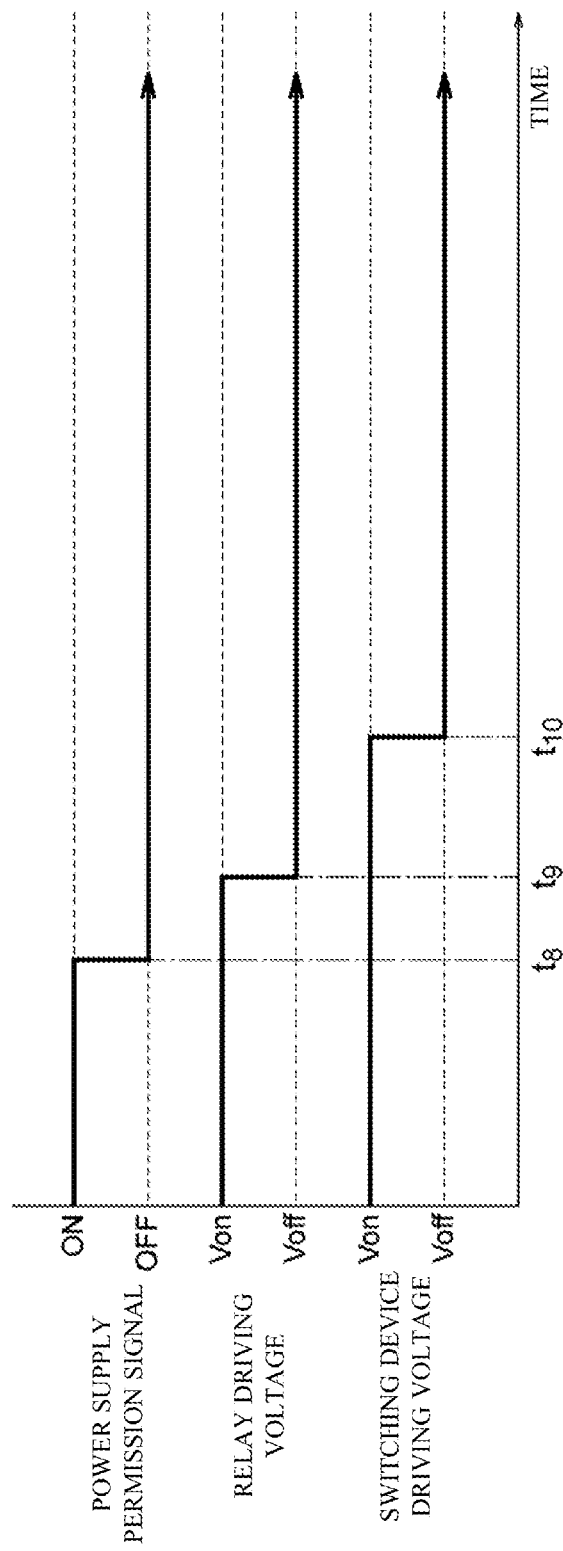
FIG. 8 represents graphs illustrating the On/Off state of a power supply signal and the characteristics of a driving voltage of a relay and a driving voltage of a switching device in a case in which a current path is in a non-conductive state.

FIG. 8 represents graphs illustrating the On/Off state of the power supply signal and the characteristics of the driving voltage of the relay 4 and the driving voltage of the switching device 3 in a case in which the current path is in the non-conductive state, and self-diagnoses of the switching device 3 and the relay 4 are performed.

As illustrated in FIG. 8, as the initial state before the self-diagnoses of the switching device 3 and the relay 4 are performed, the power supply signal is On, and the driving voltage of the relay 4 and the driving voltage of the switching device 3 are $V_{ON}$. The driving control device 5, before time $t_8$, determines whether or not the state of the current path is in the non-conductive state based on detected values detected by sensors. Then, in a case in which the state of the current path is the non-conductive state, the driving control device 5 transmits a control signal representing the non-conductive state to the control device 8. When the control signal is received, the control device 8 determines whether or not there is no influence on the operation of the load device 2, charging/discharging of the DC power supply, or the like by opening the current path. In a case in which there is no effect on the operation of the load device 2, the charging/discharging of the DC power supply, or the like, the control device 8 transmits a power supply permission signal of "Off" to the driving control device 5 as a response signal to the control signal.

The driving control device 5 receives the power supply permission signal of "Off" at time $t_8$, lowers the driving voltage of the relay 4 from $V_{ON}$ to $V_{OFF}$ at time $t_9$ that is after the elapse of a predetermined time from the time $t_8$, thereby switching the relay 4 from the On state to the Off state. Then, the driving control device 5 lowers the driving voltage of the switching device 3 from $V_{ON}$ to $V_{OFF}$ to perform switching of the switching device 3 from On state to the Off state at time $t_{10}$ that is after the elapse of a predetermined time from the time $t_9$. In addition, since a high current does not flow through the relay 4 in the non-conductive state, even when the relay 4 is switched to the Off state before the switching device 3, there is a low possibility that heat generation or the like occurs at the contact points of the relay 4.

The driving control device 5 performs a fault diagnosis of the relay 4 based on the detected values detected by the voltage sensors 6A to 6C or the detected values detected by the current sensors 7A and 7B for a period from the time $t_9$ to the time $t_{10}$.

A smoothing capacitor is connected to the input side (DC side) of the inverter 21, and a discharging resistor and the like of the capacitor are also connected to the current path. For this reason, for example, in a case in which the capacitor is discharged and a resultant current is consumed through the discharging resistor when the current path becomes a non-conductive state even in the non-conductive state, a current according to the discharging of the capacitor flows through the current path. In addition, as an example other than the discharging of the capacitor, for example, in a case in which power is consumed by the load device 2 or in a case in which a leakage path between the positive electrode and the negative electrode of the DC power supply 1 is present in the current path, a current flows even in the non-conductive state. When the relay 4 is switched from On state to the Off state, such a current does not flow in accordance with the opening of the current path. For this reason, in a case in which the relay 4 is normal, the relay is switched to the Off state at time $t_9$, and accordingly, a current does not flow through the current path after the time $t_9$. On the other hand, in a case in which a fault of short-circuit formation of the relay 4 occurs, a current flows through the current path for a period from the time $t_9$ to the time $t_{10}$. For this reason, the driving control device 5, for the period from the time $t_9$ to the time $t_{10}$ can diagnose a fault of the relay 4 based on a comparison result while comparing detected values detected by the sensors with thresholds set in advance.

In this way, in this embodiment, the driving control device 5 detects a non-conductive state using sensors, and, in a case in which the current path is in the conductive state, sets the relay 4 to be in the Off state and then switches the switching device to the Off state, thereby opening the current path. In this way, the current path can be open while the contact points of the relay 4 are protected.

In addition, in this embodiment, the driving control device 5, in a case in which the current path is in the non-conductive state, performs a fault diagnosis of the relay 4 based on detected values detected by the sensors for a period from a time point at which the relay 4 is set to the Off state to a time point at which the switching device 3 is set to be in the Off state. In this way, the protection of circuit devices and the like can be achieved while the security of the system improves.

In a case in which the current path is in the non-conductive state, the driving control device 5 may perform self-diagnoses of the switching device 3 and the relay 4 for a period from the time $t_8$ to the time $t_9$ and a period after the time $t_{10}$. The control sequence of the driving control device 5 will be described with reference to FIG. 9.

Figure 9:
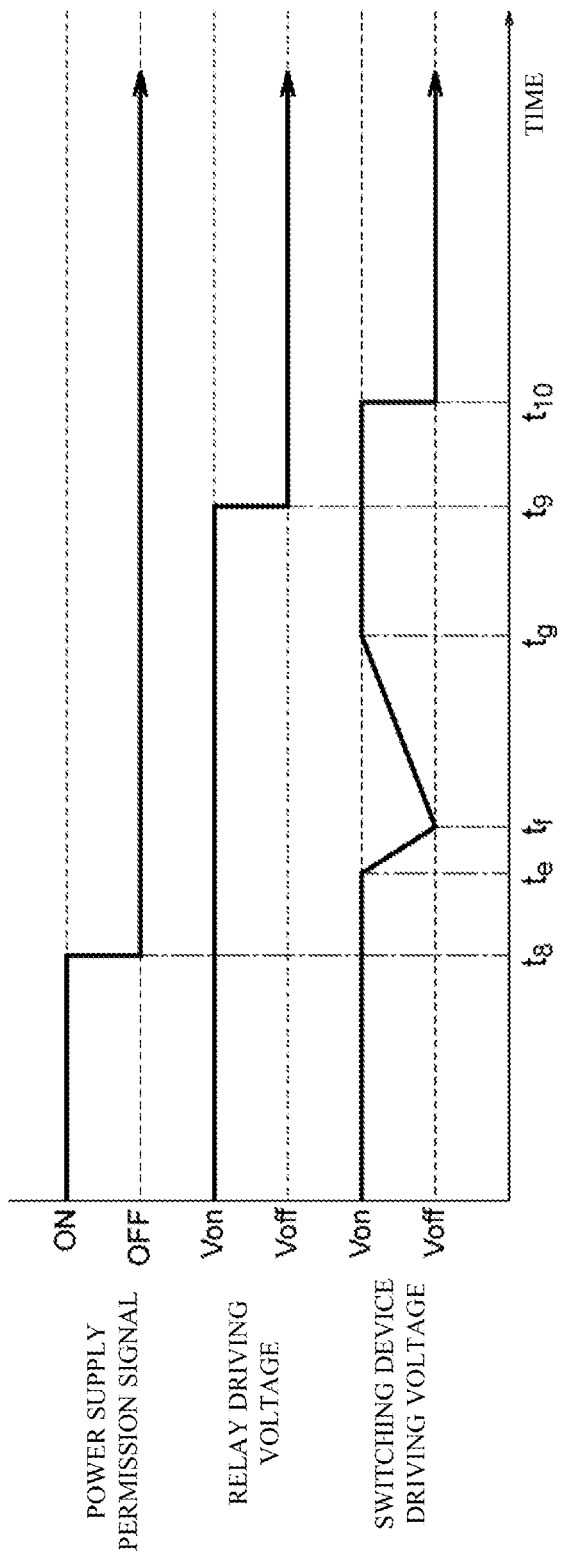
FIG. 9 represents graphs illustrating the On/Off state of a power supply signal and the characteristics of a driving voltage of a relay and a driving voltage of a switching device in a case in which a current path is in a non-conductive state.

FIG. 9 represents graphs illustrating the On/Off state of the power supply signal and the characteristics of the driving voltage of the relay 4 and the driving voltage of the switching device 3 in a case in which the current path is in the non-conductive state, and self-diagnoses of the switching device 3 and the relay 4 are performed.

A power supply signal of "Off" is received at time $t_8$, the driving voltage of the relay 4 is lowered from $V_{ON}$ to $V_{OFF}$ at time $t_9$, and the driving voltage of the switching device 3 is lowered from $V_{ON}$ to $V_{OFF}$ at time $t_{10}$, which is similar to the control performed in the sequence illustrated in FIG. 8.

The driving control device 5 lowers the driving voltage of the switching device 3 from $V_{ON}$ at time $t_e$ that is after time $t_8$. When the driving voltage becomes $V_{OFF}$ at time $t_f$ that is after the time $t_e$, the driving control device 5 raises the driving voltage of the switching device 3 from $V_{OFF}$. Then, the driving voltage becomes $V_{ON}$ at time $t_g$. Accordingly, in a case in which the current path is in the non-conductive state, before the relay 4 is switched to the Off state, the driving control device 5 sets the switching device 3 to be in the Off state (turned off and turned on) for a period from time $t_e$ to time $t_g$.

The driving control device 5 performs a fault diagnosis of the switching device 3 based on the detected values detected by the voltage sensors 6A to 6C or the detected values detected by the current sensors 7A and 7B for a period from the time $t_e$ to the time $t_g$. In a case in which the switching device 3 is normal, for a period from the time $t_e$ to the time $t_g$, when the driving voltage of the switching device is lower than $V_{ON}$, a current that has flowed changes at a time point of the time $t_e$. The current that has flowed before the time $t_e$ is a current flowing through the current path in accordance with the discharging of the capacitor or the like. On the other hand, in a case in which a fault of short-circuit formation of the switching device 3 occurs, even when the driving voltage of the switching device 3 becomes lower than $V_{ON}$, a state in which the current path is a closed circuit is continued, and accordingly, the current flowing at the time point of the time $t_e$ does not change, or the amount of change in the current is small. For this reason, the driving control device 5 can diagnose a fault of the switching device 3 based on a comparison result while comparing detected values detected by sensors with thresholds set in advance for a period from the time $t_e$ to the time $t_g$.

In addition, the driving control device 5 performs a fault diagnosis of the relay 4 based on the detected values detected by the voltage sensors 6A to 6C or the detected values detected by the current sensors 7A and 7B for a period from time $t_9$ to time $t_{10}$. In a case in which the relay 4 is normal, when the relay 4 is in the Off state at the time $t_9$, a current that has flowed at the time point of the time $t_9$ changes. The current that has flowed before the time $t_9$, similar to the description presented above, is a current flowing through the current path in accordance with discharging of the capacitor or the like. On the other hand, in a case in which a fault of short-circuit formation of the relay 4 occurs, even when the driving voltage of the relay 4 is lower than $V_{ON}$, the current that has flowed at the time point of the time $t_9$ does not change, or the amount of change in the current is small. For this reason, the driving control device 5 can diagnose a fault of the relay 4 based on a comparison result while comparing detected values detected by sensors with thresholds set in advance for a period from the time $t_9$ to the time $t_{10}$.

In this way, in this embodiment, in a case in which the current path is in the non-conductive state, the driving control device 5, before switching the relay 4 to the Off state, for a predetermined period, sets the switching device 3 to be in the Off state and performs a fault diagnosis of the switching device based on detected values detected by the sensors. In this way, the protection of circuit devices and the like can be achieved while the security of the system improves.

In addition, in this embodiment, in a case in which the current path is in the non-conductive state, the driving control device 5 performs a fault diagnosis of the switching device 3 based on detected values detected by sensors within a period from a time point (time $t_9$) at which the relay 4 is switched to the Off state to a time point (time $t_{10}$)) at which the switching device 3 is set to be in the Offs state. In this way, the protection of circuit devices and the like can be achieved while the security of the system improves.

In addition, in this embodiment, the relay 4 may be connected to the power supply line N disposed on the negative electrode side, and the switching device 3 may be connected to the power supply line P disposed on the positive electrode side.

In addition, in this embodiment, the driving control device 5 may perform fault diagnoses of the switching device 3 and the relay 4 based on the detected values detected by the voltage sensors 6A to 6C or the detected values detected by the current sensors 7A and 7B for a period from the time $t_3$ to the time $t_4$ illustrated in FIG. 4. In a case in which the switching device 3 and the relay 4 are normal, a current flowing from the DC power supply 1 to the current path gradually increases according to an increase in the gate voltage of the switching device 3 in a period from the time $t_3$ to the time $t_4$. On the other hand, in a case in which a fault of short-circuit formation of the switching device 3 occurs, a case in which a fault of open-circuit formation of the switching device 3 occurs, or a case in which a fault of open-circuit formation (Off fixation) of the relay 4 occurs, even when the driving control device 5 performs control of the switching device 3 to raise the gate voltage of the switching device 3, a current does not flow from the DC power supply 1 to the current path. The driving control device 5 checks whether or not a current flows through the current path by using sensors in a state in which the switching device 3 is controlled to raise the gate voltage of the switching device 3. Then, in a case in which it is checked that no current flows through the current path, the driving control device 5 determines that there is a fault in one switch of the switching device 3 and the relay 4.

In addition, in this embodiment, the driving control device 5 may diagnose changes in the gate voltages of the switching device 3 and the characteristic of the On resistance of the switching device 3 based on detected values detected by sensors in the period from the time $t_3$ to the time $t_4$ illustrated in FIG. 4.

In addition, in this embodiment, the driving control device 5 may perform a fault diagnosis of the switching device 3 based on the detected values detected by the voltage sensors 6A to 6C or the detected values detected by the current sensors 7A and 7B in a period from the time $t_6$ to the time $t_7$ illustrated in FIG. 6 or 7. In a case in which the switching device 3 is normal, the current flowing from the DC power supply 1 to the current path gradually decreases according to a decrease in the gate voltage of the switching device 3. On the other hand, in a case in which a fault of short-circuit formation of the switching device 3 occurs, even when the driving control device 5 performs control of the switching device 3 to lower the gate voltage of the switching device 3, the current flowing through the current path does not decreased. The driving control device 5 checks whether or not the current decreases by using sensors in a state in which the switching device 3 is controlled to lower the gate voltage of the switching device 3. Then, in a case in which it is checked that the current does not decrease in the current path or the amount of decrease in the current is small, the driving control device 5 determines that a fault has occurred in the switching device 3.

In addition, in the sequence described with reference to FIG. 9, it is preferable to shorten the period from the time $t_e$ to the time $t_f$ as possibly as can such that there is no adverse effect of a surge voltage on the device in consideration of the withstand voltage of each device on the current path and the inductance of the current path. In addition, for a period from the time $t_f$ to the time $t_g$, the driving control device 5 may adjust the gate voltage to be optimal for preventing a rush current while managing a current flowing from the DC power supply 1 to the current path by using the voltage sensors 6A to 6C or the current sensors 7A and 7B. In addition, in order to shorten the start time of the system, it is preferable that a period from the time $t_8$ to the time $t_e$ and a period from the time $t_g$ to the time $t_9$ are short as possibly as can.

In addition, in a case in which a self-diagnosis is performed when the power control device is shut down, the driving control device 5 maintains a result of the self-diagnosis until the start of the next time as information of presence/absence of a fault. Accordingly, the sequence of the period from the time $t_a$ to the time $t_c$ illustrated in FIG. 5 is unnecessary, and self-diagnoses of the switching device 3 and the relay 4 can be performed in the sequence illustrated in FIG. 4 at the time of staring up the device and in the sequence illustrated in FIG. 8 at the time of shutting down the device. In this way, the startup time and the shutting-down time of the device can be shortened.

In addition, in a case in which the current path is in the non-conductive state, and a self-diagnosis is performed in the sequence illustrated in FIG. 8 or 9, at the next time of starting up the device, a self-diagnosis may be performed in the sequence illustrated in FIG. 5. In the sequence illustrated in FIG. 8 or 9, information of a fault of the short-circuit formation of the relay 4 cannot be acquired, and accordingly, by performing the self-diagnosis in the sequence illustrated in FIG. 5 at the next time of starting up the device, the fault of the short-circuit formation of the relay 4 can be diagnosed in an early stage. As a result, a system having a high degree of redundancy can be realized.

In addition, as a modified example of this embodiment, the case 12 may be disposed at the DC power supply 1 so that the electric potential of the case 12 is the same as the electric potential of one electrode of the positive electrode and the negative electrode of the DC power supply. In such a case, a noise can be suppressed.

The case 12 described above corresponds to a "power supply case" according to the present invention, and the case 22 corresponds to a "load case" according to the present invention.

Second Embodiment

Figure 10:
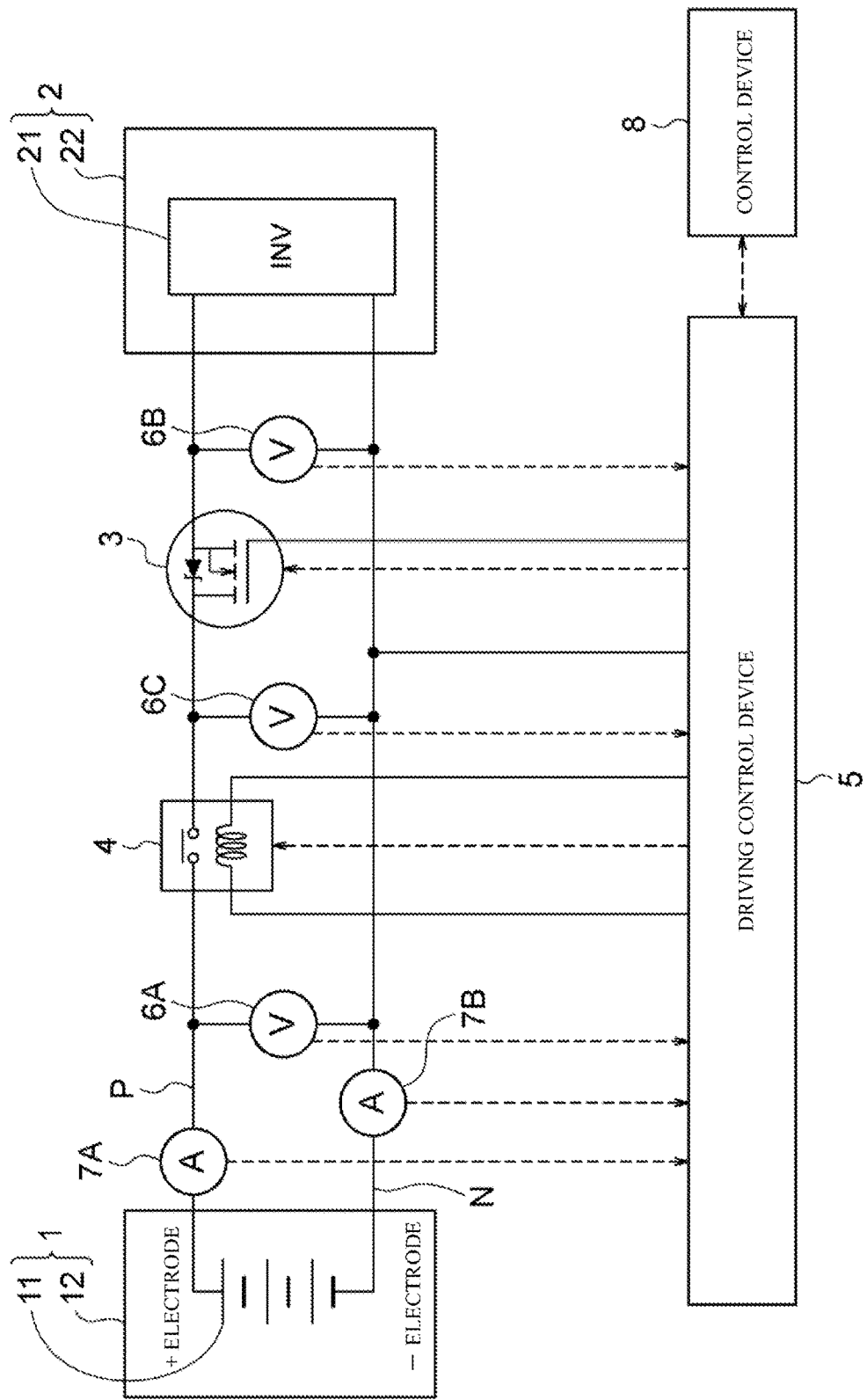
FIG. 10 is a block diagram of a power supply control apparatus according to another embodiment of the present invention.

FIG. 10 is a block diagram of a power supply control apparatus according to another embodiment of the present invention. In this embodiment, the connection position of a switching device 3 is different from that according to the first embodiment described above. The other configurations are the same as those according to the first embodiment described above, and the description thereof is incorporated by reference.

The switching device 3 is connected to a power supply line P. The switching device 3 and the relay 4 are connected in series. In other words, a series circuit of the switching device 3 and the relay 4 is connected to a positive electrode side. In addition, a first electric potential difference (an electric potential difference between a positive electrode of a battery 11 and a case 12) is larger than a second electric potential difference (an electric potential difference (an electric potential difference between a negative electrode of the battery 11 and the case).

In this embodiment, a series circuit of the switching device 3 and the relay 4, which is a high-impedance circuit, is connected to a high electric potential side (positive electrode side). Accordingly, a leakage current flowing from the case 12 or the like can be suppressed. In addition, in this embodiment the relay 4 is connected between a DC power supply 1 and the switching device 3 on a current path. In this way, the relay 4 can be arranged to a side close to the DC power supply 1, and accordingly, a leakage current can be suppressed.

In addition, in a case in which the second electric potential is larger than the first electric potential difference, the series circuit of the switching device 3 and the relay 4 may be connected to a power supply line N.

Third Embodiment

Figure 11:
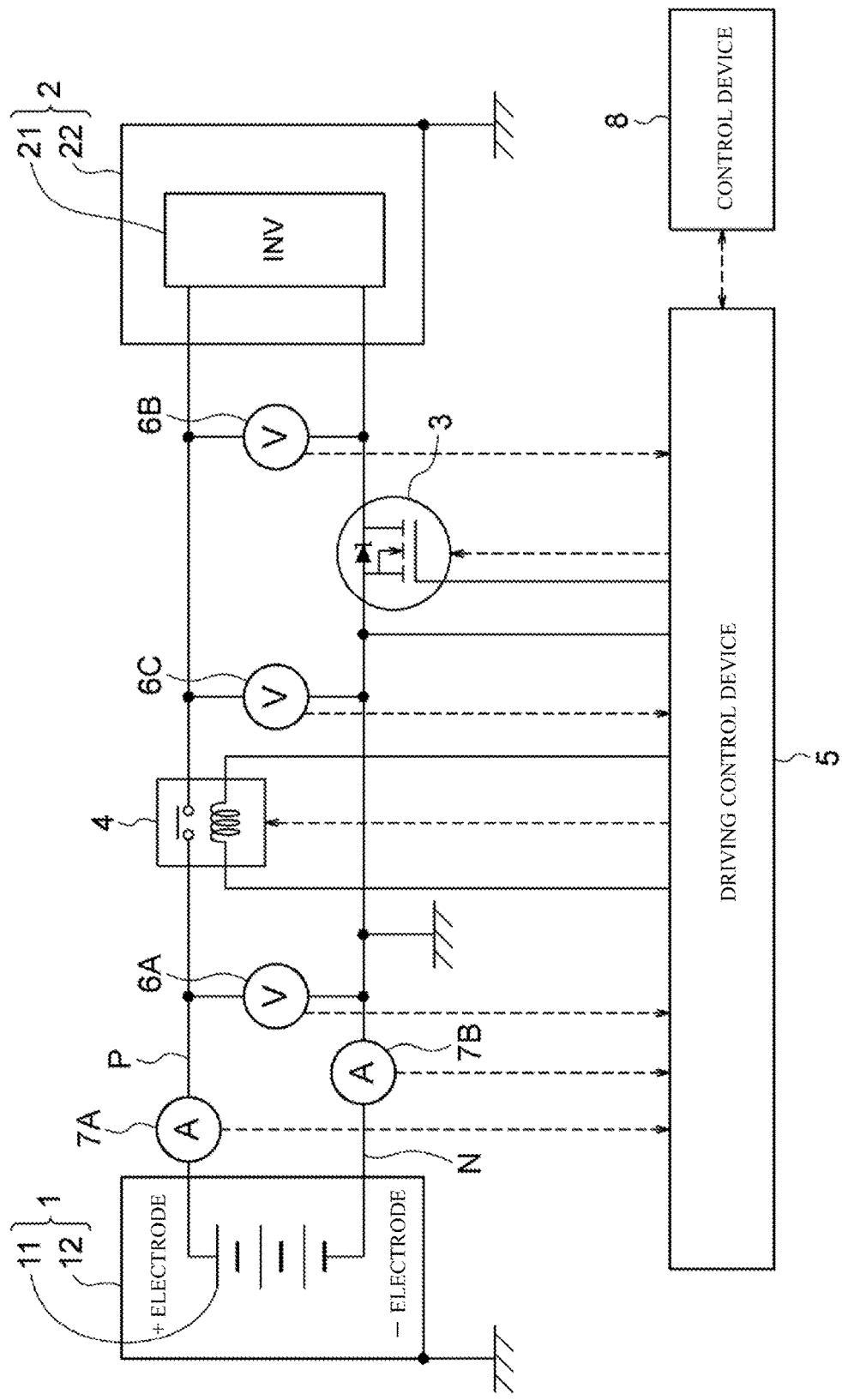
FIG. 11 is a block diagram of a power supply control apparatus according to another embodiment of the present invention.

FIG. 11 is a block diagram of a power supply control apparatus according to another embodiment of the present invention. In this example, the electric potentials of a case 12, a power supply line N, and a case 22 are the same, which is different from the first embodiment described above. The other configurations are the same as those according to the first embodiment, and the description of the first embodiment or the second embodiment is appropriately incorporated by reference.

Since the case 12, the power supply line N, and the case 22 are grounded (earth grounded), the electric potentials of the case 12, the power supply line N, and the case 22 are the same. Accordingly, an impedance circuit (relay 4) is connected to the high electric potential side (positive electrode side), and thus, a leakage current flowing from the case 12 or the like can be suppressed.

Figure 12:
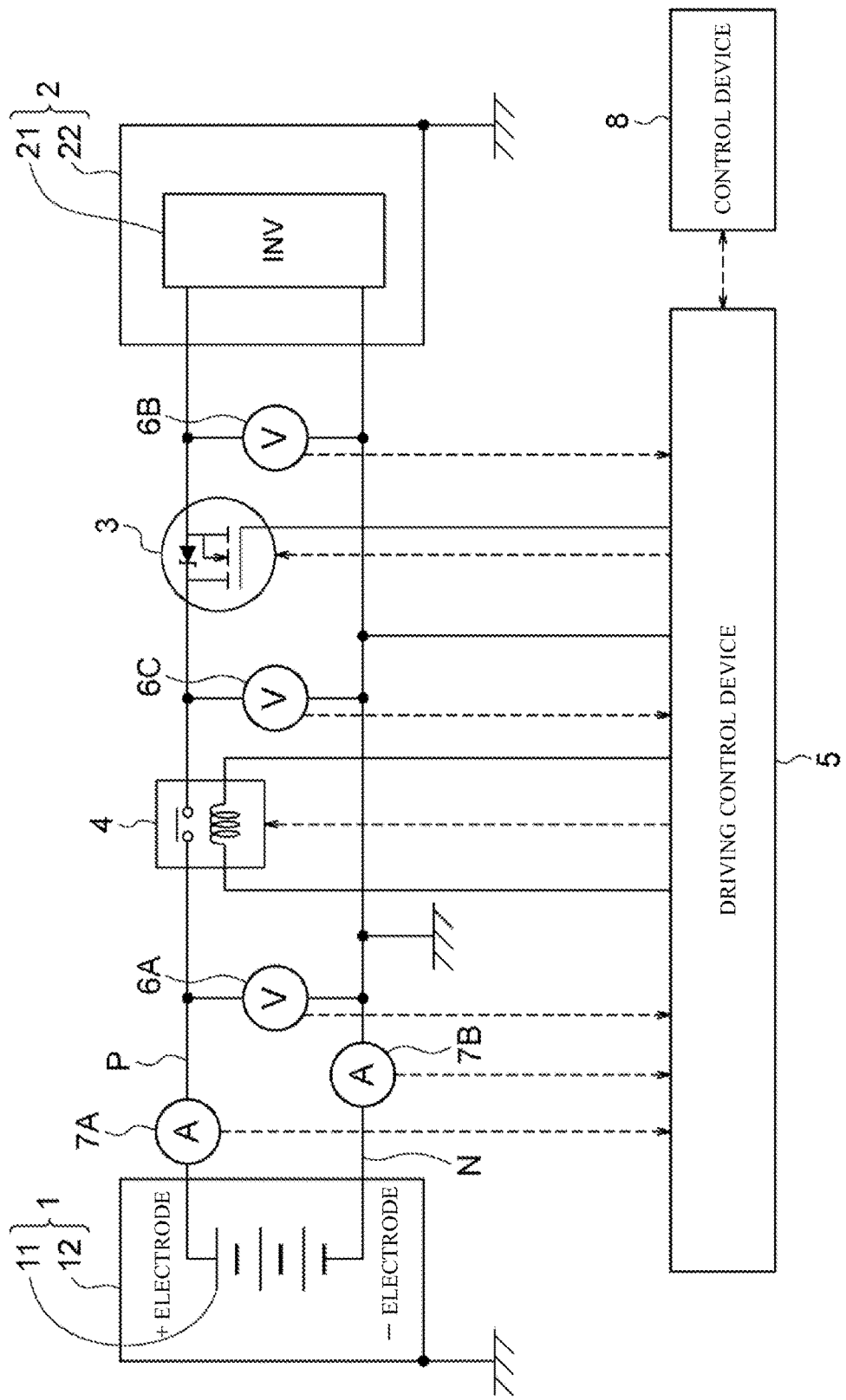
FIG. 12 is a block diagram of a power supply control apparatus according to a modified example.

In addition, as a modified example of the power supply control apparatus according to this embodiment, as illustrated in FIG. 12, a switching device 3 may be connected to a power supply line P. Accordingly, a series circuit of the switching device 3 and the relay 4, which is a high-impedance circuit, is connected to the high electric potential side (positive electrode side), and thus, a leakage current flowing from the case 12 or the like can be suppressed.

DESCRIPTION OF REFERENCE NUMERALS

1 DC power supply
2 Load device
3 Switching device
4 Relay
5 Driving control device
6A, 6B, and 6C Voltage sensor
7A and 7B Current sensor
8 Control device
9 Relay
11 Battery
12 Case
21 Inverter
22 Case
P and N Power supply line

The invention claimed is:

1. A power supply control apparatus comprising:
a DC power supply that is electrically connected to a load and has a positive electrode and a negative electrode;
a current path that is connected from the positive electrode to the negative electrode through the load;
a relay that is connected to the current path in series;
a switching device that is connected to the current path in series;
a sensor that is connected to the current path and detects a current or a voltage; and
a controller that controls the relay and the switching device,
wherein the controller detects a state in which a current flowing through the current path is lower than a predetermined current threshold as a non-conductive state by using the sensor and, in a case in which the current path is the non-conductive state, opens the current path by setting the relay to an OFF state and then switching the switching device to the OFF state.

2. The power supply control apparatus according to claim 1, wherein the controller, in a case in which the current flowing through the current path is equal to or higher than the predetermined current threshold, opens the current path by switching the switching device to the Off state and then setting the relay to the Off state.

3. The power supply control apparatus according to claim 1, wherein the controller, in a case in which the current path is in the non-conductive state, performs a fault diagnosis of the relay based on a detected value detected by the sensor within a period from a time point at which the relay is set to the Off state to a time point at which the switching device is set to the Off state.

4. The power supply control apparatus according to claim 1, wherein the controller, in a case in which the current path is in the non-conductive state, before switching the relay to the Off state, sets the switching device to the Off state for a first predetermined period and performs a fault diagnosis of the switching device based on a detected value detected by the sensor within the first predetermined period.

5. The power supply control apparatus according to claim 1, wherein the controller, in a case in which the current path is in the non-conductive state, performs a fault diagnosis of the switching device based on the detected value detected by the sensor within a period from a time point at which the relay is set to the Off state to a time point at which the switching device is set to the Off state.

6. The power supply control apparatus according to claim 1, wherein the controller, in a case in which the current path is to be electrically conducted, switches the relay to an On state and then switches the switching device to the On state.

7. The power supply control apparatus according to claim 6,
wherein the controller, in a case in which the current path is to be electrically conducted, before switching the relay to the On state, sets the switching device to the On state for a second predetermined period and performs a fault diagnosis of the relay based on the detected value detected by the sensor within the second predetermined period.

8. The power supply control apparatus according to claim 1, wherein the controller, in a case in which the current path is to be electrically conducted, performs a fault diagnosis of the relay based on the detected value detected by the sensor within a period from a time point at which the relay is set to the On state to a time point at which the switching device is set to the On state.

9. The power supply control apparatus according to claim 1, wherein the controller, in a case in which the current path is to be electrically conducted, switches the relay to the On state and then, for a turning-on period of the switching device, performs fault diagnoses of the switching device and the relay based on the detected value detected by the sensor.

10. The power supply control apparatus according to claim 1, further comprising a power supply case that houses the DC power supply,
wherein the relay is connected to one electrode side out of a positive electrode side and a negative electrode side,
wherein the switching device is connected to the other electrode side out of the positive electrode side and the negative electrode side, and
wherein an electric potential difference between the other electrode and the power supply case is smaller than an electric potential difference between the one electrode and the power supply case.

11. The power supply control apparatus according to claim 1, further comprising a power supply case that houses the DC power supply,
wherein a series circuit of the relay and the switching device is connected to one electrode side out of a positive electrode side and a negative electrode side, and
wherein an electric potential difference between the one electrode and the case is larger than an electric potential difference between the power supply case and the other electrode out of the positive electrode side and the negative electrode side.

12. The power supply control apparatus according to claim 11, wherein the relay is connected between the DC power supply and the switching device on the current path.

13. The power supply control apparatus according to claim 1, further comprising:
a power supply case that houses the DC power supply; and
a load case that houses the load,
wherein electric potential of the power supply case and electric potential of the load case are the same.

14. The power supply control apparatus according to claim 1, further comprising a power supply case that houses the DC power supply,
wherein electric potential of the power supply case is the same as one of electric potential of the current path of the positive electrode side and electric potential of the current path of the negative electrode side.

15. A method of controlling a power supply control apparatus including a current path from a positive electrode of a DC power supply to a negative electrode of the DC power supply through a load, a relay that is connected to the current path in series, a switching device that is connected to the current path in series, a sensor that is connected to the current path and detects a current or a voltage, and a controller that controls the relay and the switching device, the method comprising:
detecting a state in which a current flowing through the current path is lower than a predetermined current threshold as a non-conductive state by using the sensor; and
opening the current path by setting the relay to an Off state and then switching the switching device to the Off state in a case in which the current path is the non-conductive state.

* * * * *